(12) United States Patent
Eckhardt et al.

(10) Patent No.: US 7,684,533 B2
(45) Date of Patent: Mar. 23, 2010

(54) PHASE LOCK LOOP JITTER MEASUREMENT

(75) Inventors: James Eckhardt, Pleasant Valley, NY (US); Paul D. Muench, Poughkeepsie, NY (US); George E. Smith, III, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 922 days.

(21) Appl. No.: 11/457,161

(22) Filed: Jul. 13, 2006

(65) Prior Publication Data

US 2006/0269031 A1 Nov. 30, 2006

Related U.S. Application Data

(63) Continuation-in-part of application No. 11/138,151, filed on May 26, 2005, now abandoned.

(51) Int. Cl.
*H04L 7/00* (2006.01)
(52) U.S. Cl. .................................................. 375/371
(58) Field of Classification Search .................. 375/371
See application file for complete search history.

(56) References Cited

U.S. PATENT DOCUMENTS

| | | | |
|---|---|---|---|
| 5,563,921 A | 10/1996 | Mesuda et al. | 375/376 |
| 5,663,942 A | 9/1997 | Ishibashi et al. | 369/47 |
| 5,828,255 A | 10/1998 | Kelkar et al. | 327/157 |
| 6,295,315 B1 | 9/2001 | Frisch et al. | |
| 6,813,174 B1 * | 11/2004 | Srinivasan | 365/49.15 |
| 6,983,394 B1 | 1/2006 | Morrison et al. | |
| 7,023,195 B2 | 4/2006 | Rosenbaum et al. | |
| 7,120,215 B2 | 10/2006 | Li et al. | |
| 2004/0059524 A1 * | 3/2004 | Watson et al. | 702/45 |

* cited by examiner

*Primary Examiner*—David C Payne
*Assistant Examiner*—Tanmay K Shah
(74) *Attorney, Agent, or Firm*—William A. Kinnaman, Jr.

(57) ABSTRACT

A jitter measurement circuit and method having an input for receiving a reference signal whose jitter is to be measured, an input for receiving a clock signal having a series of cycles, and a measurement circuit for measuring the delay between the reference signal and the clock signal on a cycle by cycle bases, giving a cycle to cycle jitter measurement. The measurement circuit includes a plurality of n stages, each stage having a delay element including an input. The second and later delay elements have their inputs connected to the output of the previous stage and the first delay element has an input for receiving the reference signal. One of n latches is connected to the input of a corresponding one of the delay elements. Each latch has a clock input for receiving the clock signal, and an output for latching the value on the latches input when the clock input is clocked by an edge of the clock signal. An analysis logic circuit is provided having a plurality of n inputs connected to the outputs of the latches. The analysis logic circuit analyzes the values on the latches to give a measure of jitter.

5 Claims, 6 Drawing Sheets

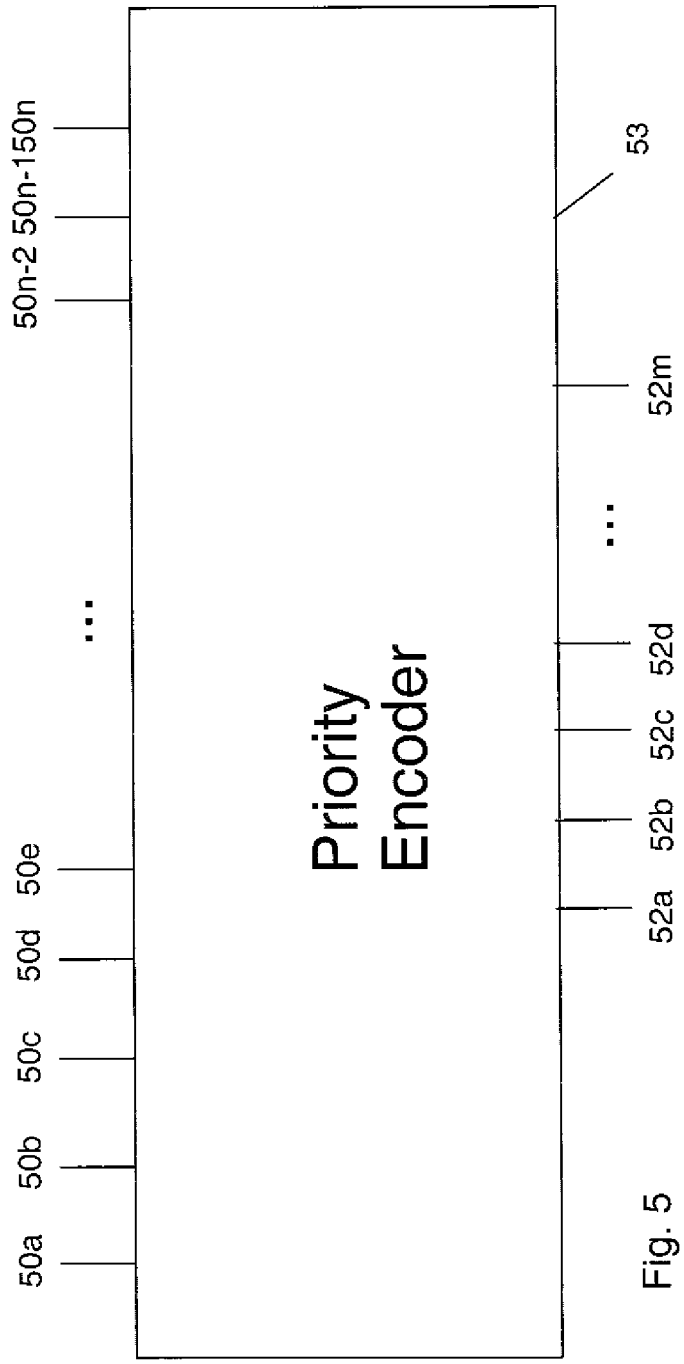

US 7,684,533 B2

PHASE LOCK LOOP JITTER MEASUREMENT

CROSS-REFERENCE TO RELATED APPLICATIONS:

This application is a continuation-in-part of copending U.S. patent Ser. No. 11/138151 filed May 26, 2005 by James Eckhardt et al. for PHASE LOCK LOOP JITTER MEASUREMENT.

FIELD OF THE INVENTION

This invention relates to measuring jitter in signals, and particularly to measurement of phase lock loop jitter using an on-chip circuit.

BACKGROUND OF THE INVENTION

As computer cycle times have decreased, Phase Lock Loop (PLL) jitter has become a more important part of the entire timing budget. Traditionally, PLL jitter has been measured in a lab environment using high speed oscilloscopes and related equipment. This means that it is difficult to measure the PLL jitter in an assembled machine and nearly impossible to measure it in a customer's environment. This invention adds jitter measurement capability directly to the PLL circuit, so jitter can be measured during normal operation.

SUMMARY OF THE INVENTION

A circuit has been added to the PLL (on chip) to measure the delay between the reference and feedback clocks on a cycle by cycle basis. This gives the cycle to cycle jitter measurement. By use of logic, long term jitter measurements can be made. These measurements can be performed during normal system operation, in any environment, including in a customer's location.

System and computer program products corresponding to the above-summarized methods are also described and claimed herein.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 5 is a block diagram of one analysis logic circuit the circuits of FIG. 1 and 4;

FIG. 6 is a truth table of the circuit of FIG. 5; and

The detailed description explains the preferred embodiments of the invention, together with advantages and features, by way of example with reference to the drawings.

DETAILED DESCRIPTION OF THE INVENTION

Figure 1:
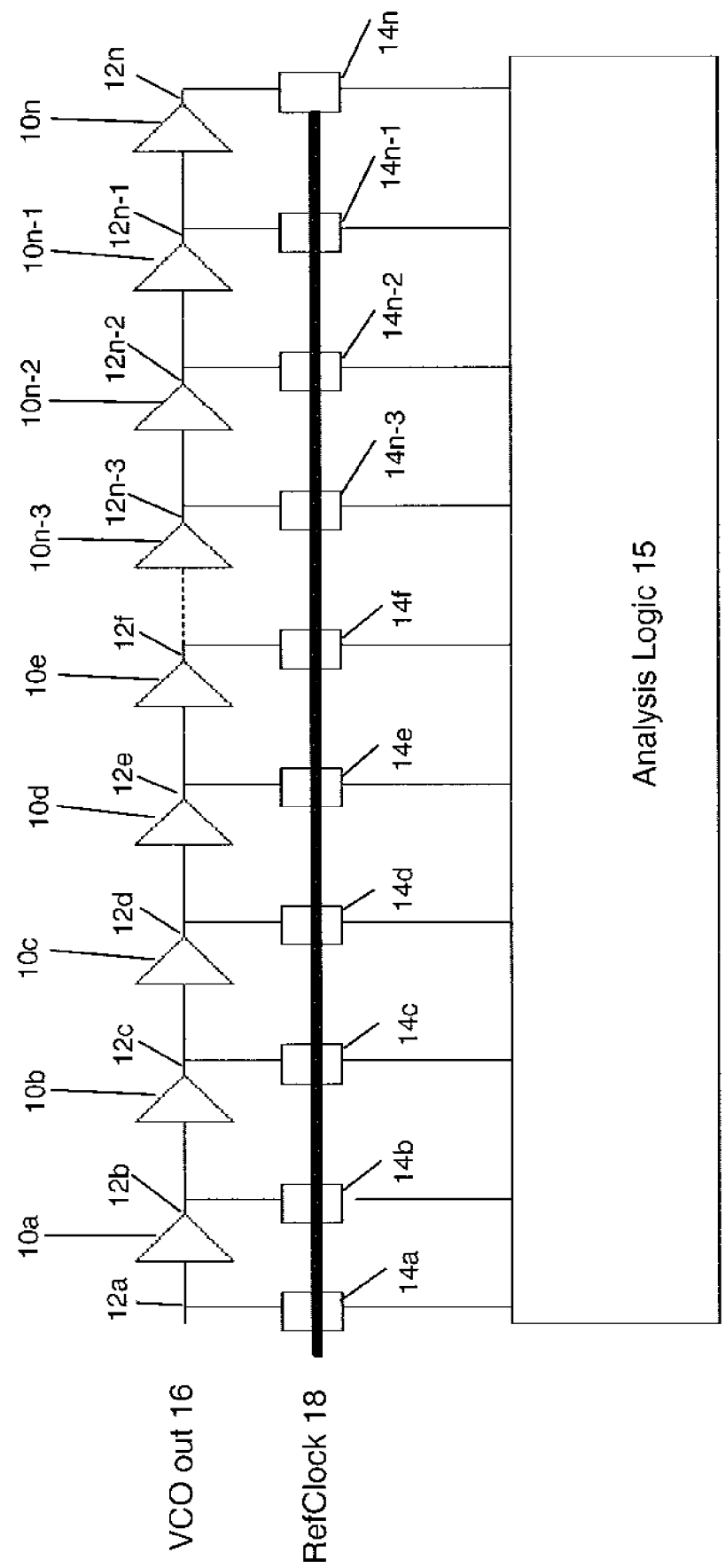
FIG. 1 is a schematic diagram of one embodiment of the jitter measurement circuit of the invention wherein the circuit has multiple stages and analysis logic to analyze signals from the stages of the jitter measurement circuit.

FIG. 1 is a schematic diagram of a Phase Lock Loop (PLL) jitter measurement circuit of the present invention. The measurement circuit of FIG. 1 has n stages. The input of the first stage may be measured at 12$a$ and the output of second and later stages may be measured at each of the points 12$b$-12$n$. The circuit includes delay elements 10$a$-10$n$, each at the end of the measurement circuit stages 12$a$-12$n$. A plurality of latches 14$a$-14$n$ latch the measurements at points 12$a$-12$n$. The outputs of the latches 14$a$-14$n$ are connected to an analysis logic circuit 15. The output of a Voltage Controlled Oscillator (VCO out) of the PLL 16 is input into the measurement circuit of FIG. 1 as will be explained, and a Reference Clock (RefClock) 18 clocks the latches 14$a$-14$n$ as will be explained.

The delay elements 10$a$-10$n$ could be implemented in any of several ways. For example, an active inverter or buffer could be used, or wire delay could be used, or LC delay lines could be used, as desired.

Each latch 14$a$-14$n$ is a conventional edge triggered latch, which transfers and holds its input to its output when an edge occurs on its clock input RefClock 18. Either or both edges could be used, as desired.

The VCO out 16 can be connected to either the PLL's vco, or feedback clock input, or connected to any signal whose jitter it is desired to measure. The RefClock 18 input would normally be connected to the PLL's reference clock. This is used as the reference for measurements.

Figure 2:
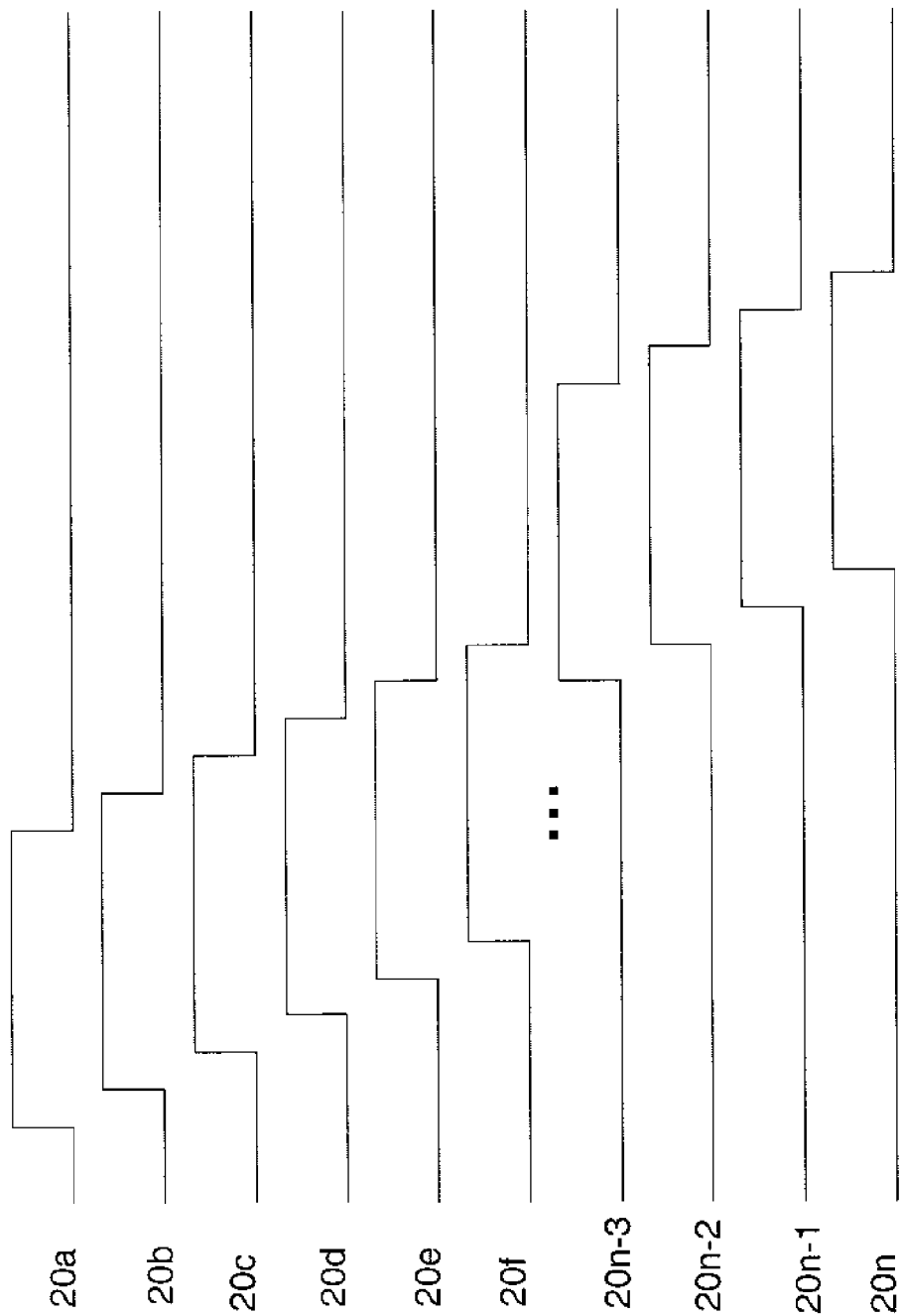
FIG. 2 illustrates waveforms of the stages of the measurement circuit of FIG. 1.

FIG. 2 illustrates the waveforms of the circuit of FIG. 1 and shows typical waveforms 20$a$-20$n$ of the points 12$a$-13$n$, respectively. Each of the delay elements 10$a$-10$a$ delay the waveforms of the previous stage and set the resolution of the measurements.

Figure 3:
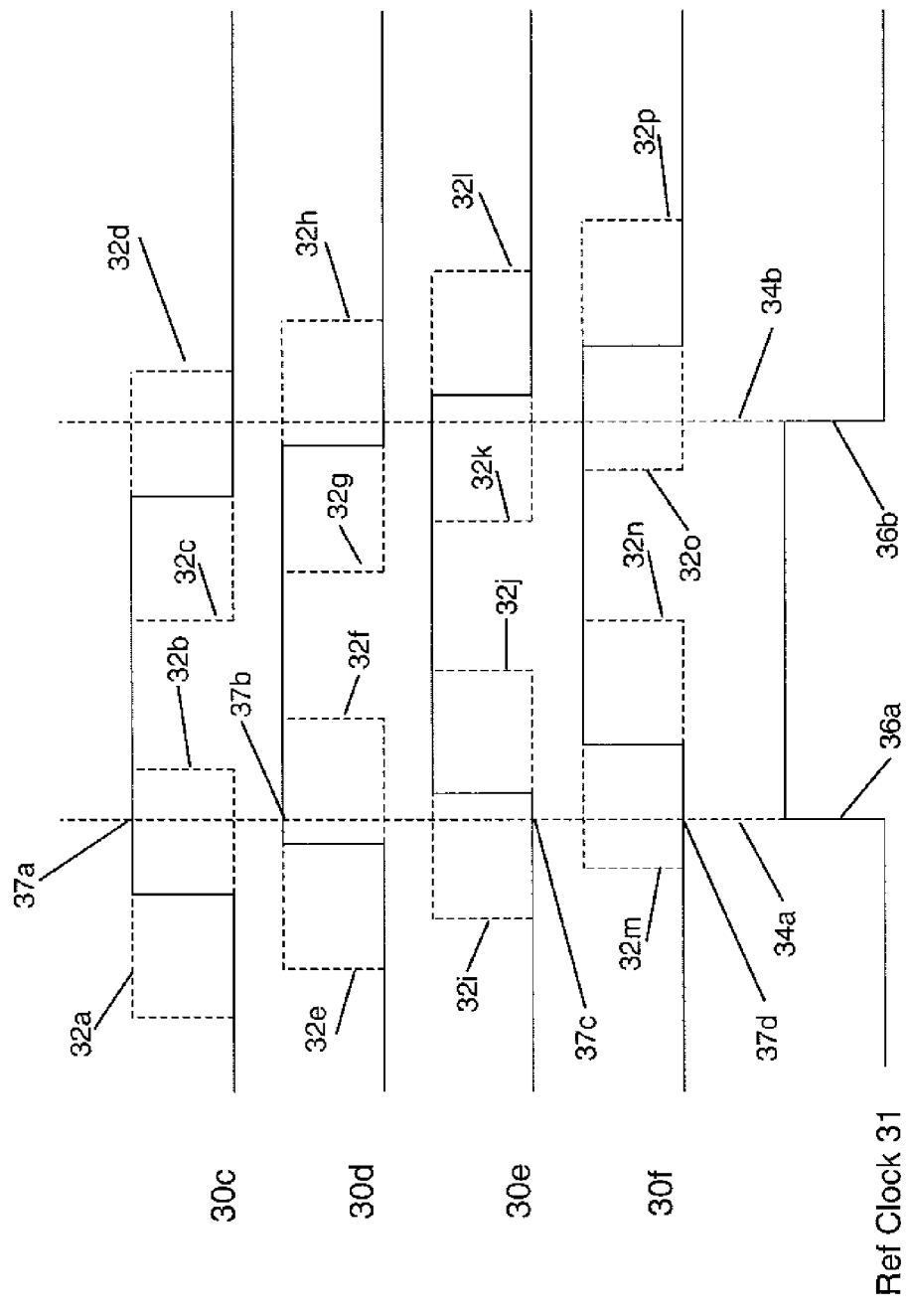
FIG. 3 illustrates waveforms of four of the stages of the circuit of FIG. 1 with clock edges to indicate possible edge locations due to jitter.

FIG. 3 shows a detail of FIG. 2, with four of the outputs 30$c$-30$f$ and the wave form 31 of the reference clock 18. The dashed lines 32$a$-32$p$ on waveforms 30$c$-30$f$ indicate possible edge locations due to jitter. The vertical dashed lines 34$a$-34$b$ extend the Ref Clock edges 36$a$-36$b$ of wave form 31 for clearer understanding.

The circuit of FIG. 1 can choose to analyze based on the rising edge, falling edge, or both of the Ref Clock signal 18. When the chosen edge is detected, the latches 14$a$-14$n$ transfer the signals on points 12$a$-12$n$ to the outputs of latches 14$a$-14$n$, and hold the results. As shown in FIG. 3, in this example, using the rising edge and solid line positions, the data on 14$c$-14$f$ would be 1100 (37$a$-37$d$). If jitter caused the signals to be early (leftmost dashed lines), the data would be 1111. If the signal was late (rightmost dashed lines), the data would be 0000. Therefore, as the signal got later in time, the data presented would go through this sequence: 1111, 1110, 1100, 1000, 0000.

It will be understood that there are many more bits of data presented to the analysis logic 15, as only four are shown in the sample of FIG. 3.

The analysis logic 15 takes this data and does any of several possible interpretations. One implementation takes the data, uses a priority encoder to find the first 1, and outputs a position number. This could be used to increment a counter, creating a histogram of edge positions. Another option would be to log the data, saving it for later analysis. Many other implementations of the analysis logic are possible.

Figure 4:
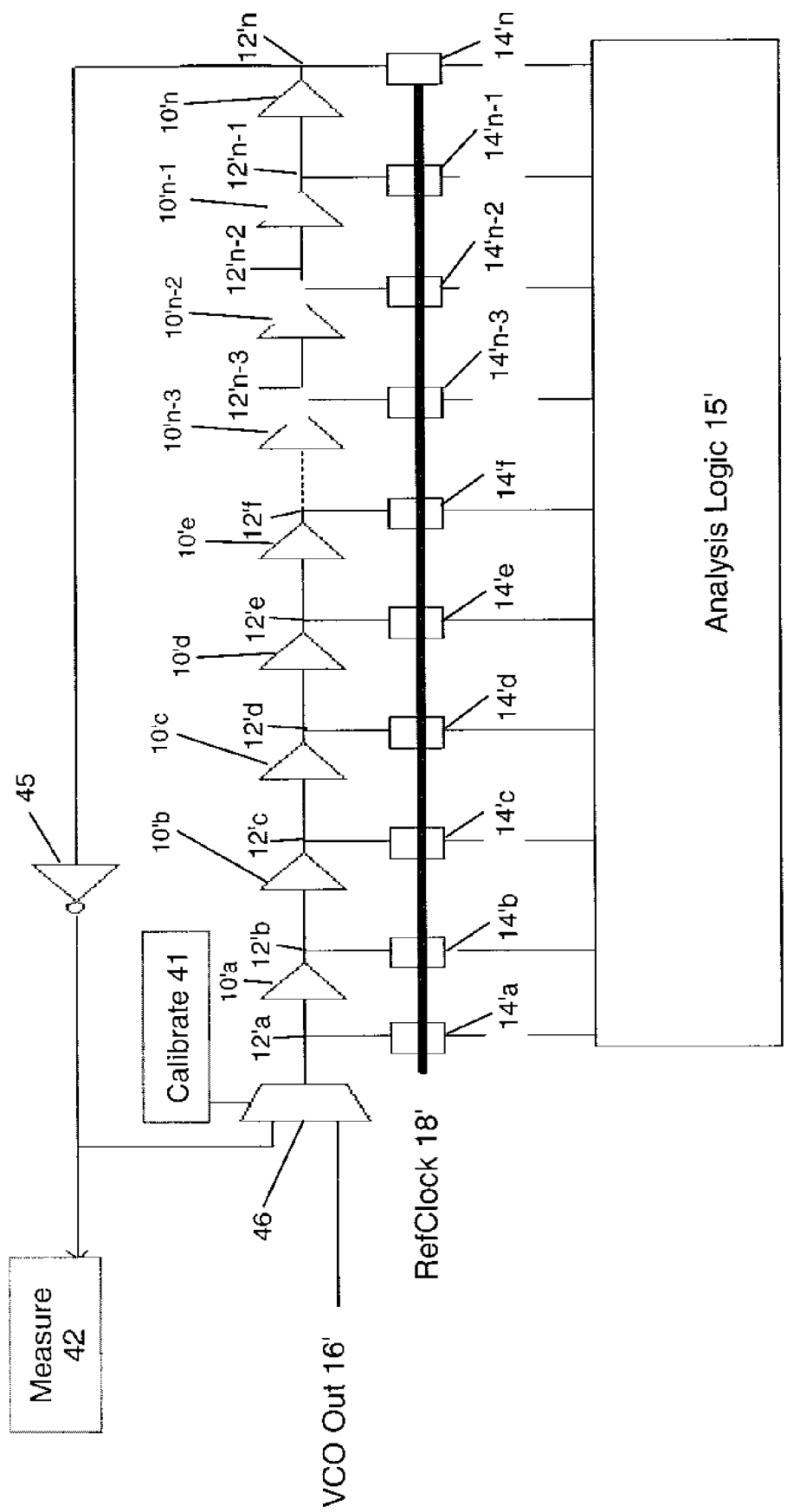
FIG. 4 is a schematic diagram of another embodiment of the jitter measurement circuit of the invention including a calibrate function.

FIG. 4 is a schematic diagram of a circuit which includes a calibration circuit 41. In the circuit of FIG. 1, data is obtained as the delay element position where the data changes from 1 to 0 (or 0 to 1). With manufacturing tolerance, this may have an unacceptably large uncertainty.

In the circuit of FIG. 4, a feedback inverter 45 and a multiplexer 46 selects between the VCO out signal 16' and an inverted copy of the signal at the end of the delay line 12'n. When the calibrate signal is asserted by the calibrate circuit 41, the loop is closed and the delay stages 12'a-12'n will oscillate with a period governed by their delay. This can then be connected to a conventional circuit at the measure output 42 to calibrate the amount of delay per stage.

FIG. 5 is one embodiment of the analysis logic 15 of FIG. 1 or analysis logic 15' of FIG. 4. The analysis logic 15 and 15' includes a priority encoder 53 which has inputs 50a-50n, each of which are connected to the outputs 14a- 14n, respectively of FIG. 1 or 14'a-14'n of FIG. 4. The priority encoder 53 has outputs 52a-52m which together gives a binary number output, depending on the signals on the inputs 50a-50n. FIG. 6 is a truth table of the priority encoder 53 of FIG. 5.

In the embodiment of FIG. 5, the priority encoder 53 puts on its outputs 52a -m the location on its inputs 50a-n. Thus the position of the 0 to 1 transitions on outputs 14 a-n of FIG. 4 or 14'a-n of FIG. 4 is represented as a simple binary number. This could be output for external analysis or fed to further logic.

Figure 7:
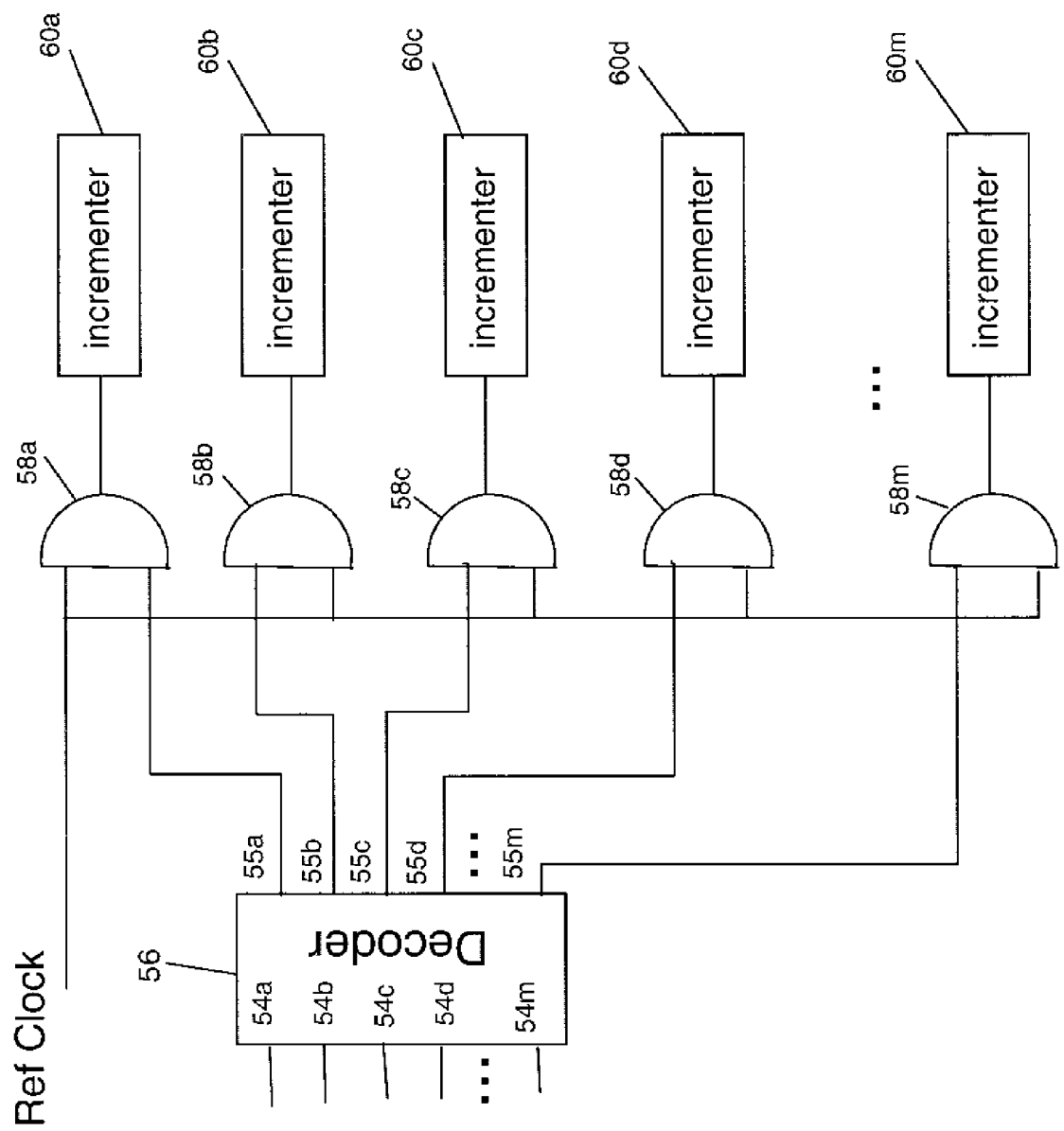
FIG. 7 is an enhancement of the analysis logic circuit of FIG. 5.

FIG. 7 shows an enhanced version of the analysis logic 15 or 15'. Logic has been added to count where each edge 36a of FIG. 3 occurs. The decoder 56 includes inputs 54a-54m, each of which are connected to the outputs 52a-52m, respectively of the priority encoder 53 of FIG. 5. The outputs 55a-55m are each connected to an AND gate 58a-58m, respectively, each of which is clocked by Ref Clock signal. The outputs of the AND gates 58a-58m are each connected to incrementers 60a-60m, respectively. The incrementers 60a-60m give a histogram of the location of the edge 36a, which is a direct measurement of jitter. The incrementer contains a counter such that the contents represent the total number of pulses seen.

A further embodiment, not illustrated, uses two encoders, one with inverted outputs, which would give the start 36a and the end 36b of the pulse of Ref Clock 31, allowing measurement of pulse width, provided the delay is long enough.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A jitter measurement circuit comprising:
an input for receiving a reference signal whose jitter is to be measured;
a clock input for receiving a clock signal having a series of cycles; and
a measurement circuit for measuring the delay between the reference signal and the clock signal on a cycle by cycle bases, giving a cycle to cycle jitter measurement, said measurement circuit comprising;
a plurality of n stages, each stage comprising a delay element having an input, the second and later delay elements having their inputs connected to the output of the previous stage and the first delay element having an input for receiving said reference signal,
a latch connected to the input of a corresponding one of the delay elements, each latch having a clock input for receiving said clock signal, and an output for latching the value on the latches input when the clock input is clocked by an edge of the clock signal, and
an analysis logic circuit having a plurality of n inputs connected to the outputs of said latches, said analysis logic circuit analyzing the values on said latches to give a measure of jitter, said analysis logic circuit comprising a priority encoder having a plurality of n inputs, each input connected to a respective one of said latch outputs, said priority encoder having a plurality of m outputs, said m outputs providing a binary number representing the signals on the priority encoder inputs, said analysis logic circuit further comprising a decoder having a plurality of m inputs, each decoder input connected to a respective one of the outputs of said priority encoder, a plurality of m AND circuits, each AND circuit having a first input for receiving the clock signal and a second input connected to a respective one of the outputs of said decoder, and a plurality of m incrementer circuits having a input connected to the output of a respective one of the outputs of said m AND circuits such that said incrementers present a histogram of the where the edge of the clock signal is located.

2. The jitter measurement circuit of claim 1 wherein said AND circuits are clocked by a one of a positive going edge or a negative going edge of said clock signal.

3. A method of measuring jitter, said method comprising:
receiving a reference signal whose jitter is to be measured at an input of a jitter measurement circuit;
receiving a clock signal at a clock signal input of said jitter measurement circuit, said clock signal having a series of cycles;
measuring with a measurement circuit, the delay between the reference signal and the clock signal on a cycle by cycle bases, giving a cycle to cycle jitter measurement;
delaying said reference signal in a plurality of n stages in said measurement circuit, each stage comprising a delay element having an input, the second and later delay elements having their inputs connected to the output of the previous stage and the first delay element having an input for receiving said reference signal;
latching in an n plurality of latches in said measurement circuit, each latch connected to the input of a corresponding one of the delay elements, each latch having a clock input for receiving said clock signal, and an output for latching the value on the latches input when the clock input is clocked by an edge of the clock signal;
analyzing to the values on said latches with an analysis logic circuit in said measurement circuit to give a measure of jitter, said analysis logic circuit having a plurality of n inputs connected to the outputs of said latches;
inverting the output of the delay element of the last stage;
multiplexing either the reference signal on the input of said jitter measurement circuit or the inverted output of the last stage to the input of the delay element of the first stage by means of a calibrate signal, such that when the inverted signal is selected, the jitter measurement circuit oscillates;
calibrating the amount of delay per stage when the circuit oscillates; and providing a binary number on the outputs of a priority encoder representing the signals on the inputs of the priority encoder, said priority encoder having a plurality of n inputs, each input connected to a respective one of said latch outputs, and a plurality of m outputs.

4. The jitter measurement method of claim 3 further comprising decoding with a decoder having a plurality of m inputs, each decoder input connected to a respective one of the outputs of said priority encoder, providing each output of said decoder to one of a plurality of in AND circuits, each AND circuit being clocked by said clock signal on a clock input, and providing a histogram of where the edge of the clock signal is located by placing the outputs of said AND circuits in a respective one of a plurality of m incrementers.

5. The jitter measurement method of claim 4 wherein said AND circuits are clocked by a one of a positive going edge or a negative going edge of said clock signal.

* * * * *